(12) United States Patent
Kushnarenko

(10) Patent No.: US 9,177,617 B2
(45) Date of Patent: Nov. 3, 2015

(54) METHODS CIRCUITS APPARATUSES AND SYSTEMS FOR PROVIDING CURRENT TO A NON-VOLATILE MEMORY ARRAY AND NON-VOLATILE MEMORY DEVICES PRODUCED ACCORDINGLY

(71) Applicant: Spansion LLC, Sunnyvale, CA (US)

(72) Inventor: Alexander Kushnarenko, Haifa (IL)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 101 days.

(21) Appl. No.: 14/048,076

(22) Filed: Oct. 8, 2013

(65) Prior Publication Data

US 2015/0098290 A1 Apr. 9, 2015

(51) Int. Cl.
*G11C 7/00* (2006.01)
*G11C 5/14* (2006.01)
*G11C 11/56* (2006.01)
*G11C 16/30* (2006.01)
*G05F 1/56* (2006.01)
*G05F 1/59* (2006.01)

(52) U.S. Cl.
CPC ............ *G11C 5/147* (2013.01); *G11C 11/5621* (2013.01); *G11C 16/30* (2013.01); *G05F 1/56* (2013.01); *G05F 1/59* (2013.01); *G11C 5/14* (2013.01)

(58) Field of Classification Search
CPC ............. G05F 1/575; G05F 1/56; G05F 1/10; G05F 1/465; G05F 1/565; G05F 1/59; G11C 11/4074; G11C 5/147; G11C 5/14
USPC ............ 365/226, 189.09, 204; 323/269, 274, 323/270
See application file for complete search history.

(56) References Cited

U.S. PATENT DOCUMENTS 7,274,176 B2 * 9/2007 Mihara .................. 323/269
8,902,678 B2 * 12/2014 Dimartino et al. ....... 365/189.09

* cited by examiner

*Primary Examiner* — David Lam
(74) *Attorney, Agent, or Firm* — Vladimir Sherman; Professional Patent Solutions

(57) ABSTRACT

Disclosed are methods, circuits, apparatuses and systems for providing power to a dynamic load such as a non-volatile memory array. According to embodiments, a voltage source may be adapted to generate and output a supply current at substantially a target voltage through a regulating transistor whose channel is in series between an output terminal of said charge pump and an input terminal of said NVM array. A discharge circuit branch coupled to an output terminal of the regulating transistor may be adapted to drain away current from the regulating transistor output terminal when a voltage at the regulating transistor output terminal exceeds a first defined threshold voltage. A bulk regulating circuit branch coupled to a bulk of the regulating transistor may be adapted to reduce a bulk-voltage of the regulating transistor when a voltage at the regulating transistor output terminal exceeds a defined threshold voltage.

24 Claims, 13 Drawing Sheets

METHODS CIRCUITS APPARATUSES AND SYSTEMS FOR PROVIDING CURRENT TO A NON-VOLATILE MEMORY ARRAY AND NON-VOLATILE MEMORY DEVICES PRODUCED ACCORDINGLY

FIELD OF THE INVENTION

The present invention relates generally to the field of semiconductors. More specifically, the present invention relates to methods, circuits, apparatuses and systems for providing electrical current to dynamic loads such as arrays of non-volatile memory cells and to integrated circuits, such as non-volatile memory devices, produced accordingly.

BACKGROUND

Non-volatile memory ("NVM") cells are fabricated in a large variety of structures, including but not limited to: (1) poly-silicon floating gate, (2) Non volatile MIRRORBIT, (3) Silicon-Oxide-Nitride-Oxide-Silicon ("SONOS"), and others. FIGS. 1A through 1C show cross-sectional views of several different NVM cell structures. Although each NVM cell structure has unique properties and operating characteristics, basic operation of NMV cells, sets or arrays of NVM cells, and devices based on these NVM cells is fundamentally similar. NVM cells are programmed (i.e. charged or discharged) to a logical state correlated with information (e.g. bits) they are to store and read by detecting their threshold voltages (Vt).

Information is stored on NVM cells by regulating and altering the NVM cell's logical state, which logical state may be defined and determined by adjusting and later reading its Vt—the gate to source voltage at which the NVM cell begins to conduct non-negligible current. Different threshold voltage ranges are associated with different logical states, and a NVM cell's threshold voltage level may be correlated to the amount of charge (e.g. electrons) stored in a charge storage region of the cell. FIG. 2A shows a voltage distribution graph depicting possible threshold voltage distributions of a binary non-volatile memory cell, wherein vertical lines depict boundary voltage values correlated with each of the cell's possible states. Cells having Vt lower than EV level are said to be erased verified. Cells having Vt higher than PV are said to be program verified. Since NVM cells may lose some amounts of stored charge, a read verify level above which the cell is also considered programmed, may be set below a program verify level. A Program sequence of programming pulses may be used to drive the Vt of a cell higher than PV, while an erase sequence may drive the cell's Vt lower than EV.

FIG. 2B shows a voltage distribution graph depicting possible threshold voltage distributions in the charge storage region of a multi-level non-volatile memory cell ("MLC"), wherein one set of vertical lines depict boundary values correlated with each of the cell's possible Program Verify Threshold Voltages (PV00, PV01, etc.), another set of vertical lines depict boundary values correlated with the Read Verify level of each of the cell's possible Program states (RV00, RV01, etc.), and yet another set depict boundary lines for Intermediate Program Verify voltages (PVI 00, PVI 01, etc.) associated with each of the states.

The amount of charge stored in a charge storage region of an NVM cell, may be increased by applying one or more programming pulses to the cell. While the amount of charge in the cell may decrease by applying an erase pulse to the NVM cell which may force the charge reduction in the cell's charge storage region, and consequently may decrease the NVM's Vt.

Most methods of operating NVM cells (e.g. programming, reading, and erasing) require one or more reference structures, such as reference cells, to generate the reference levels against which the Vt of a cell is compared. Each of the one or more reference structures may be compared against a memory cell being operated in order to determine a Vt, condition or state of the memory cell being operated. Generally, in order to determine whether an NVM cell is at a specific state, for example erased, programmed, or programmed at one of multiple possible program states within a multi-level cell ("MLC"), the cell's threshold level is compared to that of a reference structure whose threshold level is preset and known to be at a voltage level associated with the specific state being tested for.

Comparing the threshold voltage of an NVM cell to that of a reference cell is often accomplished using a sense amplifier. Various techniques for comparing an NVM threshold voltage against those of one or more reference cells, in order to determine the state(s) of the NVM's cells, are known. The most common technique includes applying the same terminal voltages and supply currents to the NVM being read and to a defined reference structure (e.g. reference cell which Vt is known) and determining which starts conduct first. FIG. 3 shows a functional block diagram of an NVM device including: (1) an array of NVM cell; (2) a set of reference structures, which structures could be from within the array; (3) one or more voltage sources for applying voltages and providing current to both the NVM cells and array structures; and (4) cell evaluation circuits(s) such as sense amps. FIG. 4 shows a composite circuit and current flow diagram depicting how applied voltages and currents may induce current flow through individually selected NVM cells within an NVM array during a reading/sensing phase.

Since the distance and number of branches through which current from an array driver may need to flow is highly variable depending upon the location and number of selected NVM cells on the array for a given operation, the resistance and capacitance experienced by the array driver likewise greatly varies from operation to operation. FIG. 5 illustrates a conventional drain driver topology along with a corresponding voltage graph indicating how the voltages transition at different points along the bit-line path during a sensing operation. The graphs also illustrate a delay and a sensing voltage error in the sensing operation introduced do to capacitance and/or resistance of the bit-lines.

SUMMARY OF THE INVENTION

The present invention includes methods, circuits, apparatus and systems for supplying current to an array of non-volatile memory cells (NVM array). According to embodiments, there is provided a power supply or array driver adapted to rapidly respond to variable NVM array loads and currents while maintaining stable and accurate output voltage. According to some embodiments, electrical current at a target voltage being supplied to at least a segment of an NVM array, for example during sensing of NVM cells in the array, may be regulated via a regulating transistor whose output terminal is selectively discharged and whose bulk voltage is selectively lowered responsive to a voltage on the output terminal of the regulating transistor exceeding a defined threshold voltage. A discharge current from the output terminal and a magnitude of bulk voltage reduction on the regulating transistor may be positively correlated, or otherwise related, to a voltage level on the regulating transistor output terminal.

According to some embodiments, the array electrical current at a target output voltage may be generated and/or supplied by a high voltage source such as a charge pump, a voltage booster, a large capacitor, or the like. The output terminal of the high voltage source may be connected to an input terminal of the regulating transistor. One or more ancillary circuit branches of the power supply circuit (e.g. array driver) may each provide functionality such as: (1) providing one or more reference voltages, (2) discharging or draining an output terminal of the regulating transistor, and (3) adjusting a bulk voltage of the regulating transistor. The regulating transistor along with its ancillary circuitry, optionally including the high voltage source, may be referred to as a drain driver circuit, a source driver circuit or as an array driver circuit (hereinafter collectively "array driver"). Accordingly, an array driver according to embodiments may include one or more reference circuit branches, one or more discharge circuit branches and one or more bulk voltage adjusting circuit branches.

According to embodiments, there may be provided a power supply circuit for a non-volatile Memory array, which power supply circuit may include or be otherwise functionally associated with a high voltage source adapted to generate and/or output an array supply current at substantially a target voltage. The power supply circuit may also include a regulating transistor whose channel is in series between an output terminal of the high voltage source and an input terminal of the memory array. The regulating transistor may be a field effect transistor (FET). A discharge circuit branch coupled to an output terminal of the regulating transistor may be adapted to drain away current from the regulating transistor output terminal when a voltage at the regulating transistor output terminal exceeds a first defined threshold voltage, and a bulk regulating circuit branch coupled to a bulk of the regulating transistor may be adapted to reduce a bulk-voltage of said regulating transistor when a voltage at the regulating transistor output terminal exceeds a second defined threshold voltage. The first and the second threshold voltages may be different or may be substantially the same voltage level.

According to some embodiments, the power supply circuit may include a reference voltage branch adapted to provide a reference voltage to said discharge and said bulk regulating circuit, wherein the reference voltage may be at least partially based on an output of the high voltage source.

The power supply circuit according to embodiments may be adapted to provide sensing current for concurrent sensing of a variable set of non-volatile memory cells. Accordingly, the regulating transistor output terminal may be connected to a multiplexer (e.g. Y-Mux) attached to an NVM array and configured to bridge current from the power supply circuit to drain lines, source lines and other terminals of the variable set of non-volatile memory cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1A:
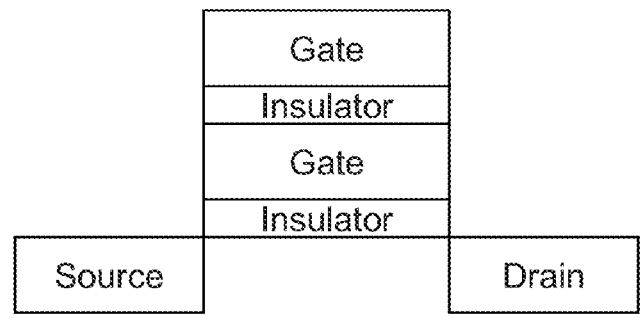
FIGS. 1A through 1C show cross-sectional views of three different NVM cell structures.
Figure 1B:
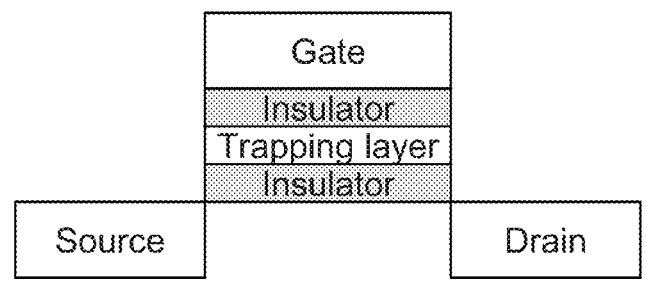
Figure 1C:
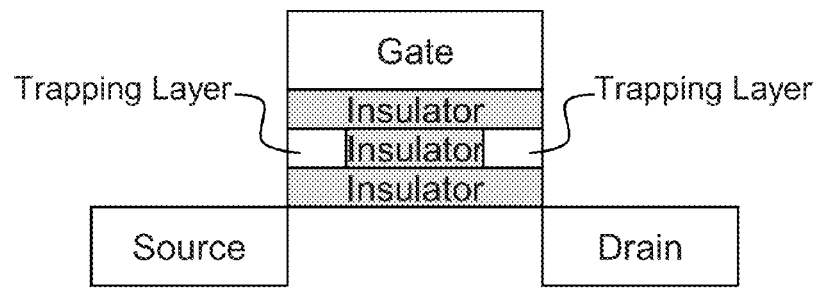
Figure 2A:
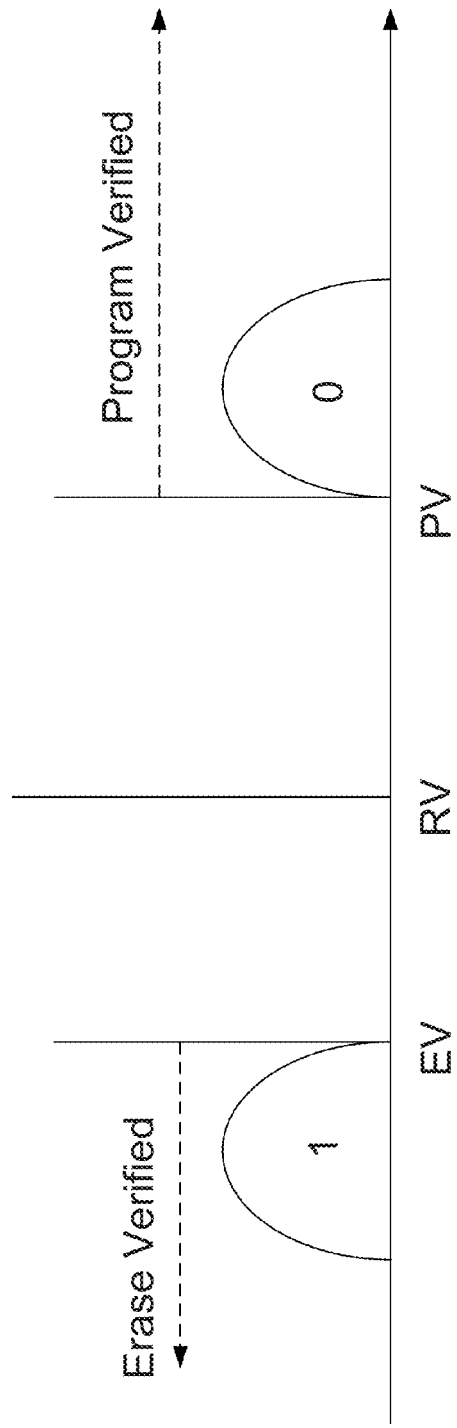
FIG. 2A shows a voltage distribution graph depicting possible threshold voltage distributions of a binary non-volatile memory cell, wherein vertical lines depict boundary voltage values correlated with each of the cell's possible states.
Figure 2B:
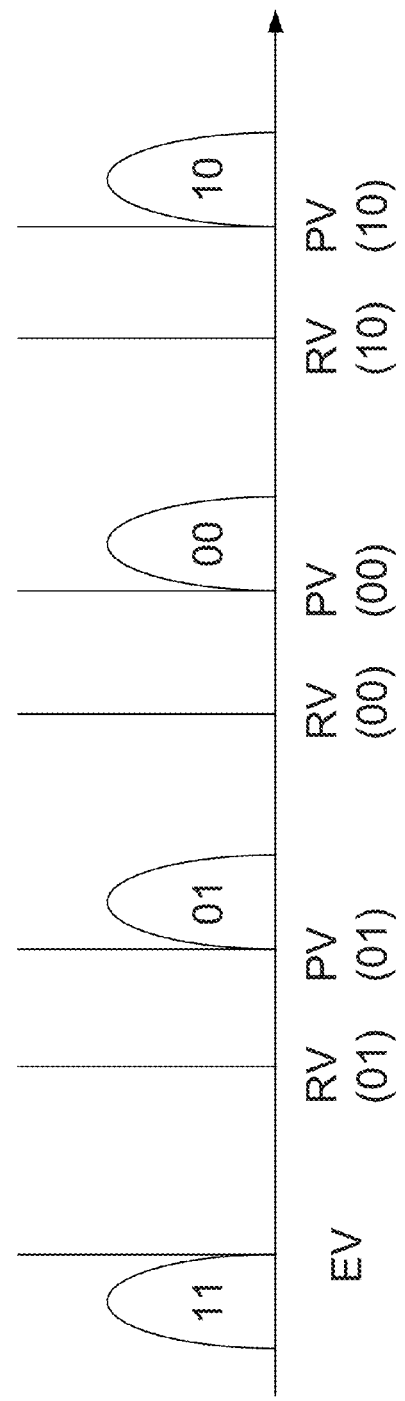
FIG. 2B shows a voltage distribution graph depicting possible threshold voltage distributions in the charge storage region of a multi-level non-volatile memory cell ("MLC"), wherein one set of vertical lines depict boundary values correlated with each of the cell's possible Program Verify Threshold Voltages (PV00, PV01, etc.), another set of vertical lines depict boundary values correlated with the Read Verify level of each of the cell's possible Program states (RV00, RV01, etc.), and yet another set depict boundary lines for Intermediate Program Verify voltages (PVI 00, PVI 01, etc.) associated with each of the states.
Figure 3:
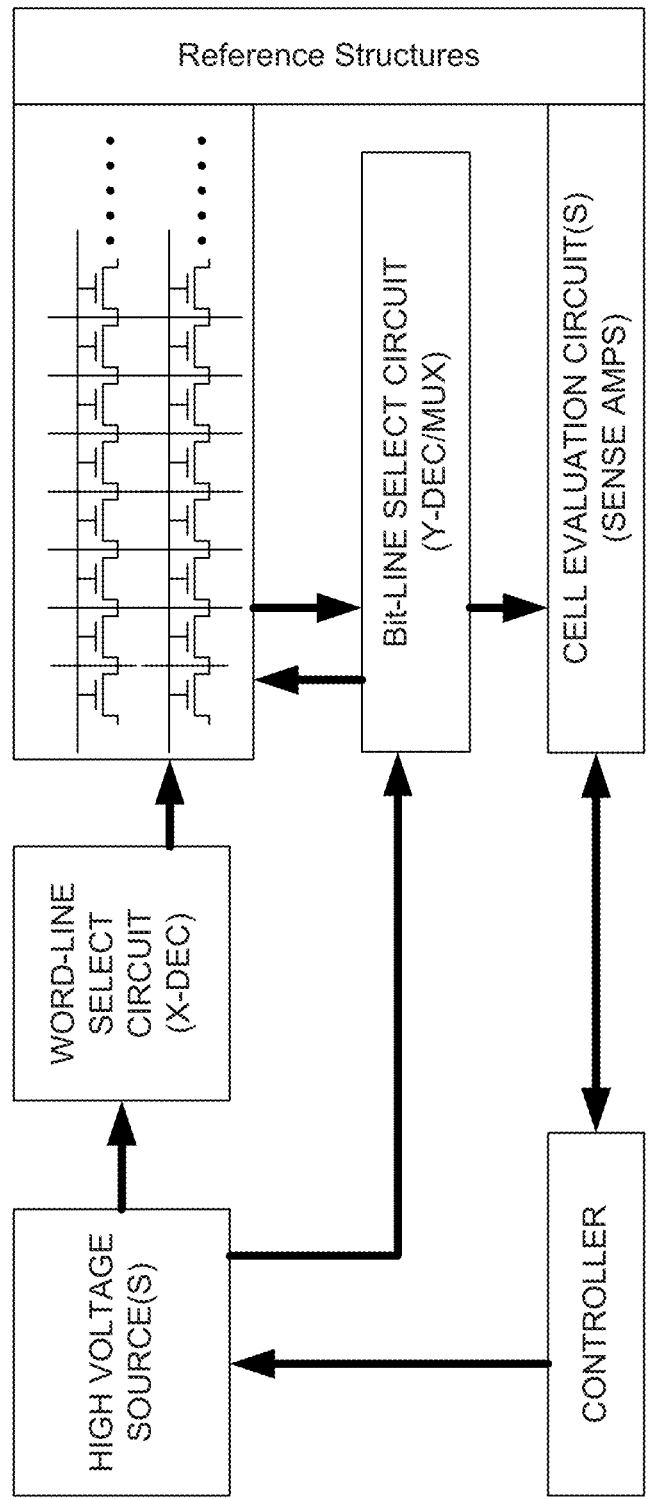
FIG. 3 shows a functional block diagram of an NVM device including: (1) an array of NVM cell; (2) a set of reference structures, which structures could be from within the array; (3) one or voltage sources for applying voltages and providing current to both the NVM cells and array structures; and (4) cell evaluation circuits(s) such as sense amps.
Figure 4:
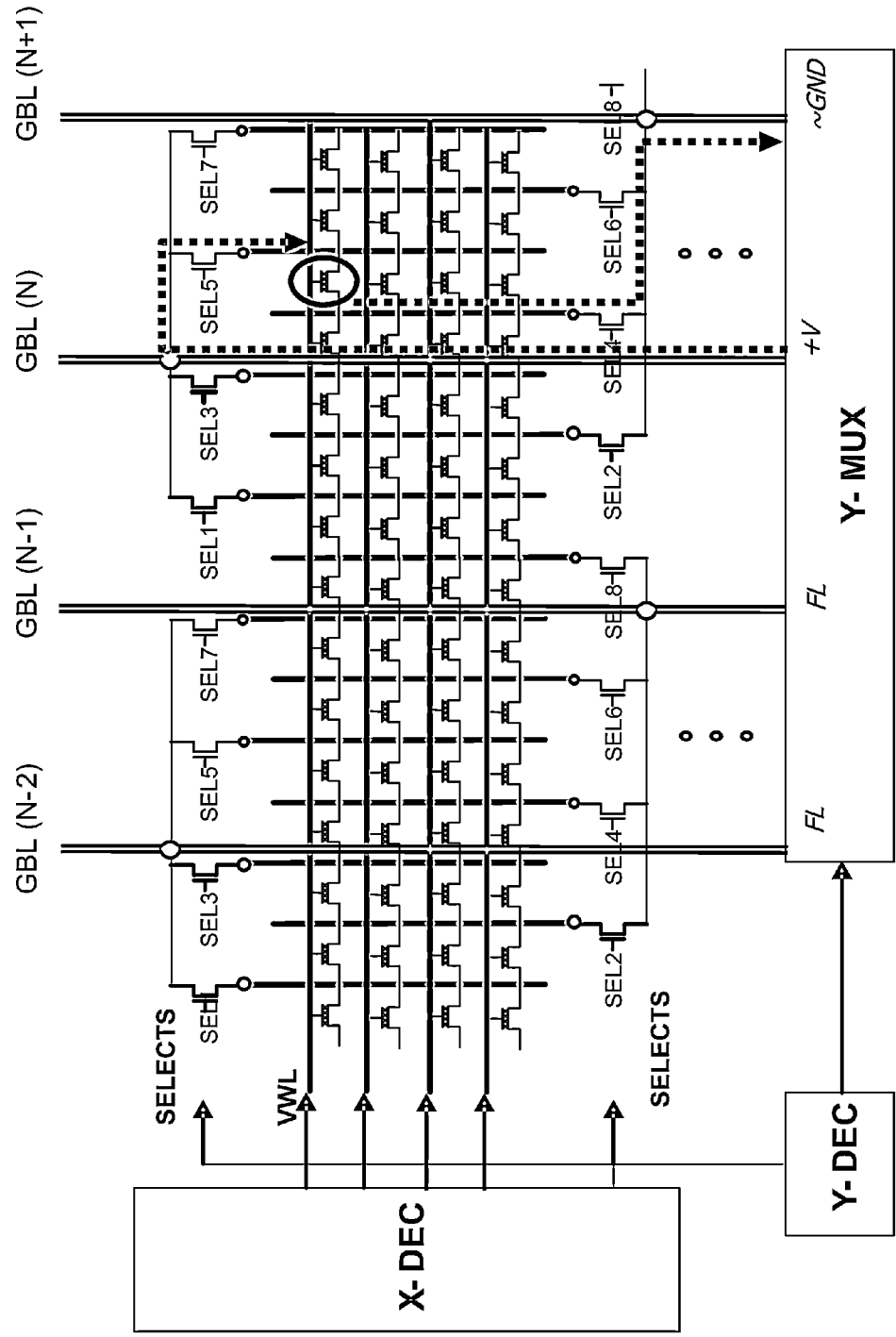
FIG. 4 shows a composite circuit and current flow diagram depicting how applied voltages and currents may induce current flow through individually selected NVM cells within an NVM array during a reading/sensing phase.
Figure 5:
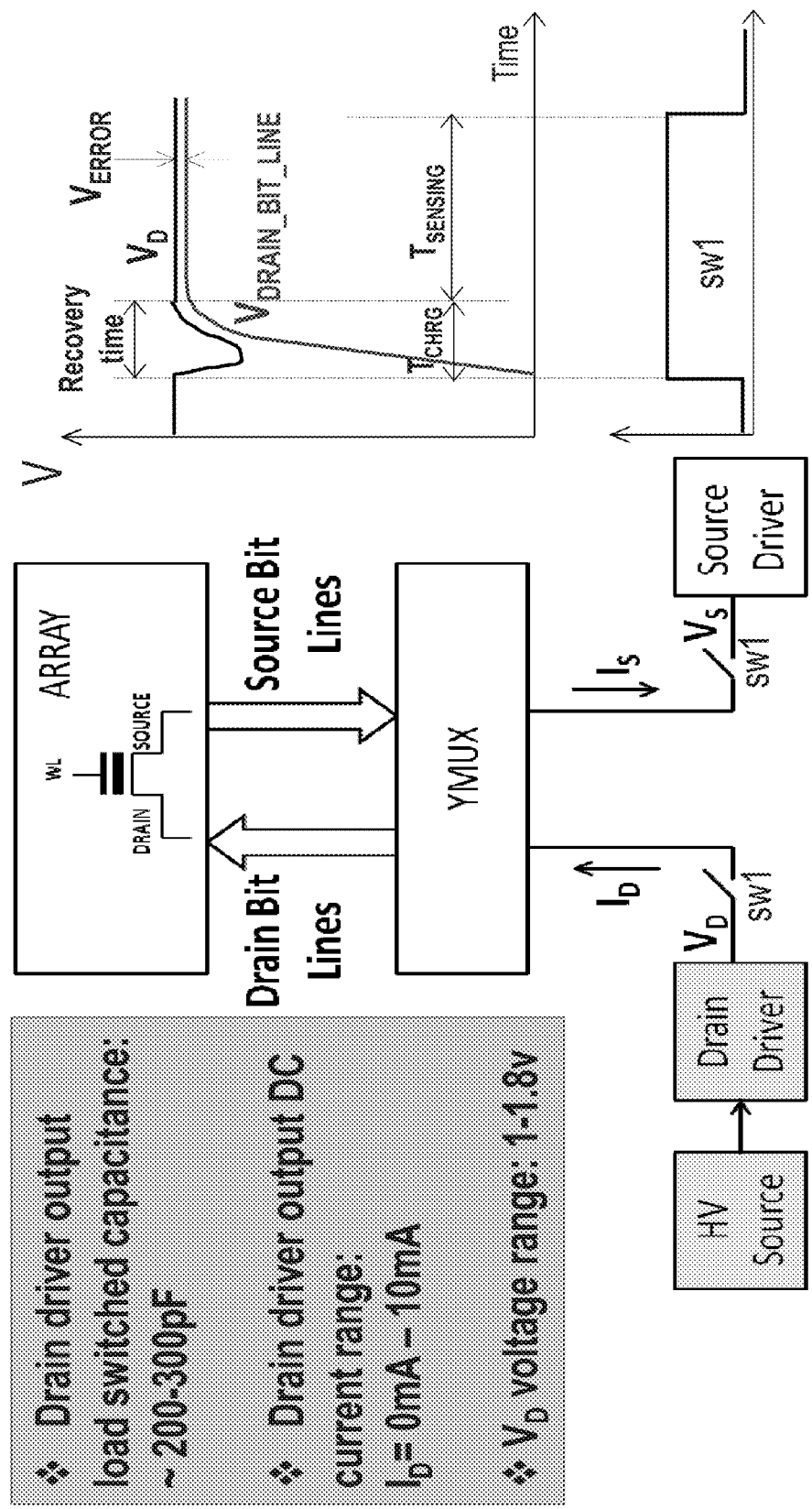
FIG. 5 illustrates a conventional drain driver topology along with a corresponding voltage graph indicating how the voltages transition at different points along the bit-line path during a sensing operation. The graphs also illustrate a delay and a sensing voltage error in the sensing operation introduced do to capacitance and/or resistance of the bit-lines.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMS) electrically programmable read-only Memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

The present invention includes methods, circuits, apparatus and systems for supplying current to an array of non-volatile memory cells (NVM array). According to embodiments, there is provided a power supply or array driver adapted to rapidly respond to variable NVM array loads and currents while maintaining stable and accurate output voltage. According to some embodiments, electrical current at a target voltage being supplied to at least a segment of an NVM array, for example during sensing of NVM cells in the array, may be regulated via a regulating transistor whose output terminal is selectively discharged and whose bulk voltage is selectively lowered responsive to a voltage on the output terminal of the regulating transistor exceeding a defined threshold voltage. A discharge current from the output terminal and a magnitude of bulk voltage reduction on the regulating transistor may be positively correlated, or otherwise related, to a voltage level on the regulating transistor output terminal.

According to some embodiments, the array electrical current at a target output voltage may be generated and/or supplied by a high voltage source such as a charge pump, a voltage booster, a large capacitor, or the like. The output terminal of the high voltage source may be connected to an input terminal of the regulating transistor. One or more ancillary circuit branches of the power supply circuit (e.g. array driver) may each provide functionality such as: (1) providing one or more reference voltages, (2) discharging or draining an output terminal of the regulating transistor, and (3) adjusting a bulk voltage of the regulating transistor. The regulating transistor along with its ancillary circuitry, optionally including the high voltage source, may be referred to as a drain driver circuit, a source driver circuit or as an array driver circuit (hereinafter collectively "array driver"). Accordingly, an array driver according to embodiments may include one or more reference circuit branches, one or more discharge circuit branches and one or more bulk voltage adjusting circuit branches.

According to embodiments, there may be provided a power supply circuit for a non-volatile memory array, which power supply circuit may include or be otherwise functionally associated with a high voltage source adapted to generate and/or output an array supply current at substantially a target voltage. The power supply circuit may also include a regulating transistor whose channel is in series between an output terminal of the high voltage source and an input terminal of the memory array. The regulating transistor may be a field effect transistor (FET). A discharge circuit branch coupled to an output terminal of the regulating transistor may be adapted to drain away current from the regulating transistor output terminal when a voltage at the regulating transistor output terminal exceeds a first defined threshold voltage, and a bulk regulating circuit branch coupled to a bulk of the regulating transistor may be adapted to reduce a bulk-voltage of said regulating transistor when a voltage at the regulating transistor output terminal exceeds a second defined threshold voltage. The first and the second threshold voltages may be different or may be substantially the same voltage level.

According to some embodiments, the power supply circuit may include a reference voltage branch adapted to provide a reference voltage to said discharge and said bulk regulating circuit, wherein the reference voltage may be at least partially based on an output of the high voltage source.

The power supply circuit according to embodiments may be adapted to provide sensing current for concurrent sensing of a variable set of non-volatile memory cells. Accordingly, the regulating transistor output terminal may be connected to a multiplexer (e.g. Y-Mux) attached to an NVM array and configured to bridge current from the power supply circuit to drain lines, source lines and other terminals of the variable set of non-volatile memory cells.

Figure 6A:
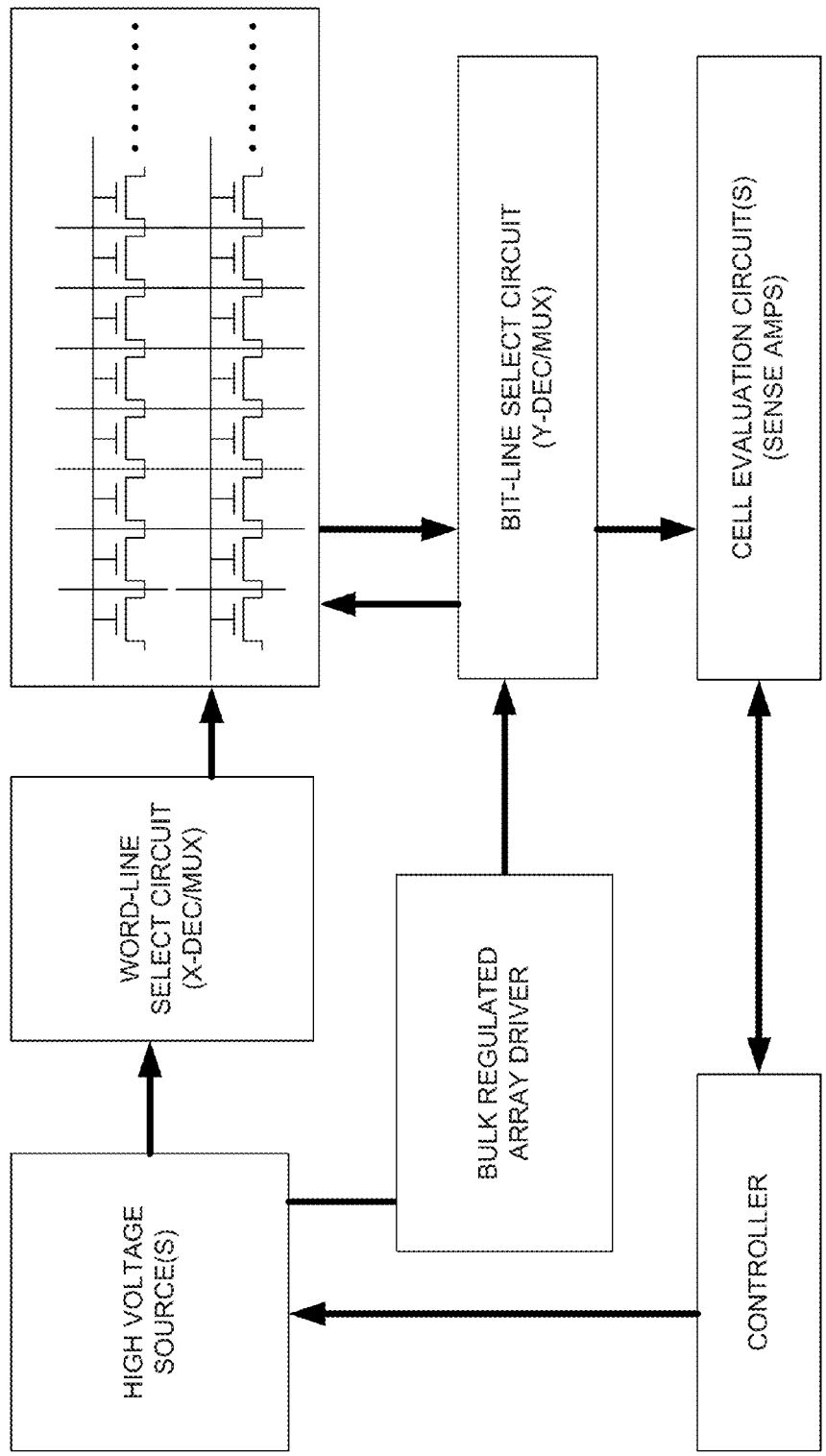
FIG. 6A is a functional block diagram of an NVM device including a bulk regulated array driver, according to embodiments.
Figure 6B:
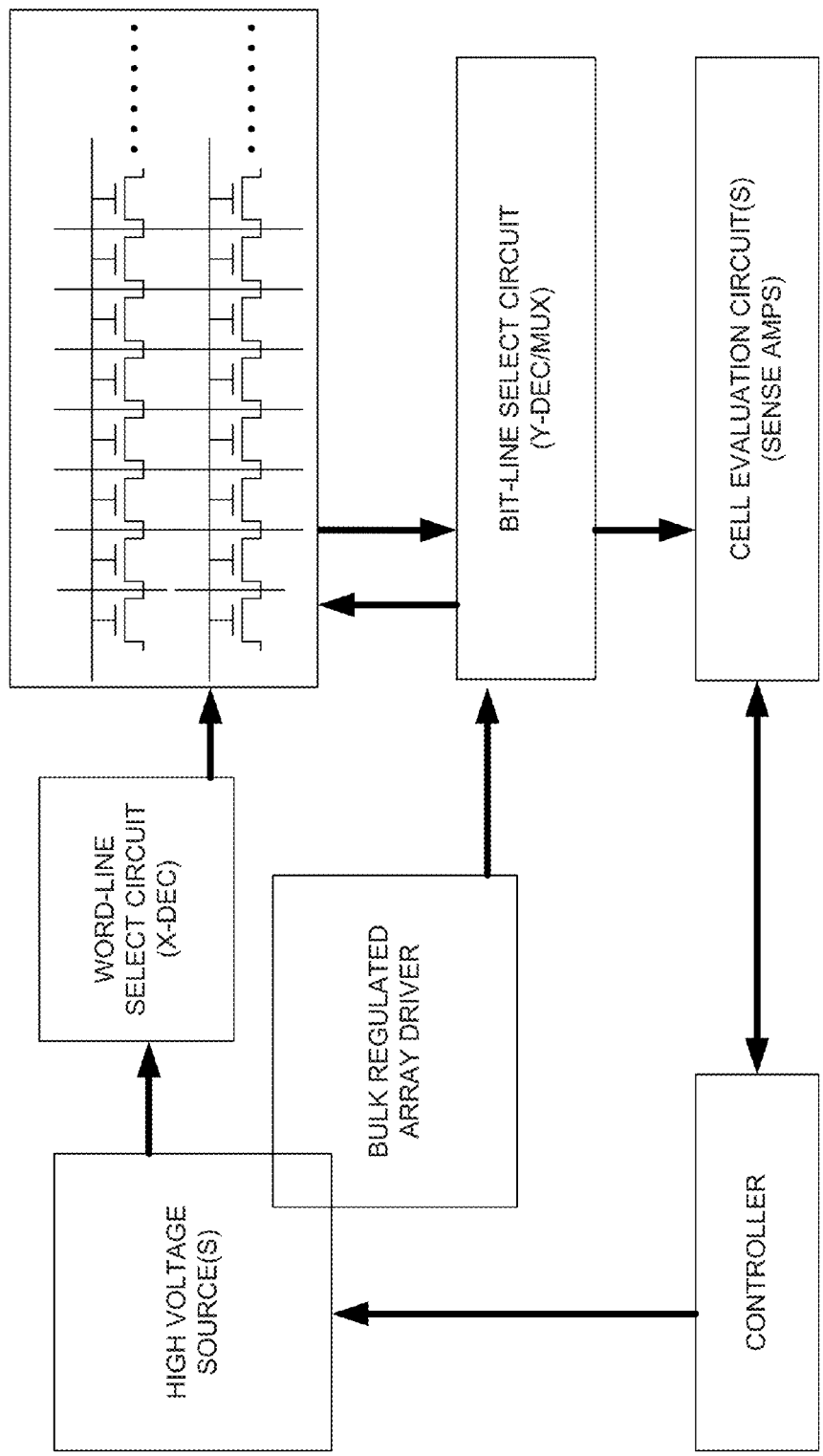
FIG. 6B is a functional block diagram of an NVM device including a bulk regulated array driver at least partially integrated with a voltage source, according to embodiments.

Turning now to FIG. 6A, there is shown a functional block diagram of an NVM device including a bulk regulated array driver, according to embodiments. The bulk regulated array driver of FIG. 6A is in series between a voltage source, such as a high voltage source, and a Y-MUX of the NVM array. The array driver may have a structure and/or operate in a manner corresponding to any of the structures shown in FIGS. 7A to 7C. FIG. 6B is a functional block diagram of an NVM device including a buck regulated array driver at least partially integrated with the voltage source. Likewise, an output of the array driver may connect with an NVM array Y-MUX, and portions of the array driver may correspond in structure and/or functionality to those shown in FIGS. 7A to 7C.

Figure 7A:
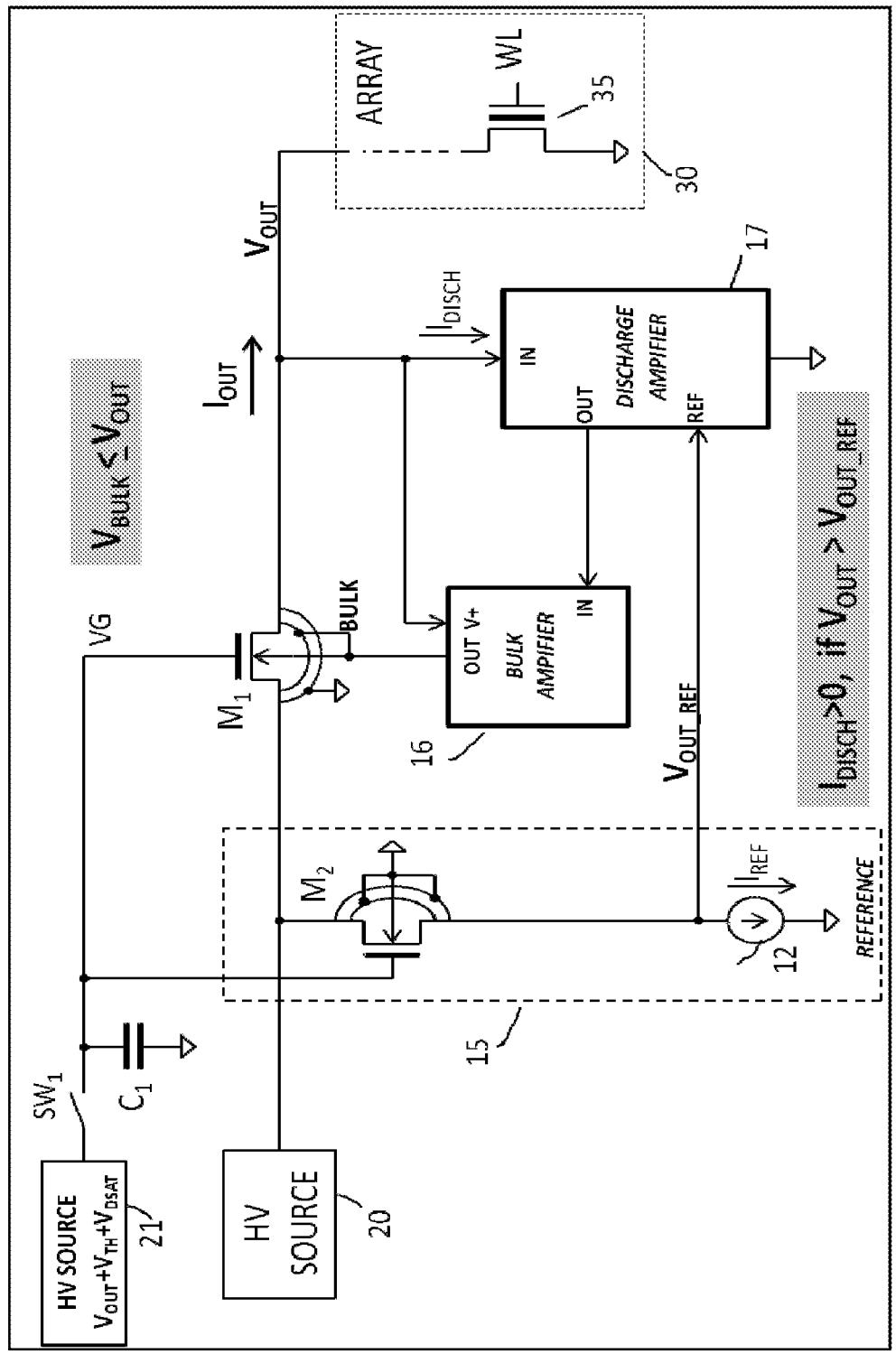
FIG. 7A is block level circuit diagram of an exemplary bulk regulated array power supply circuit according to embodiments.
Figure 8A:
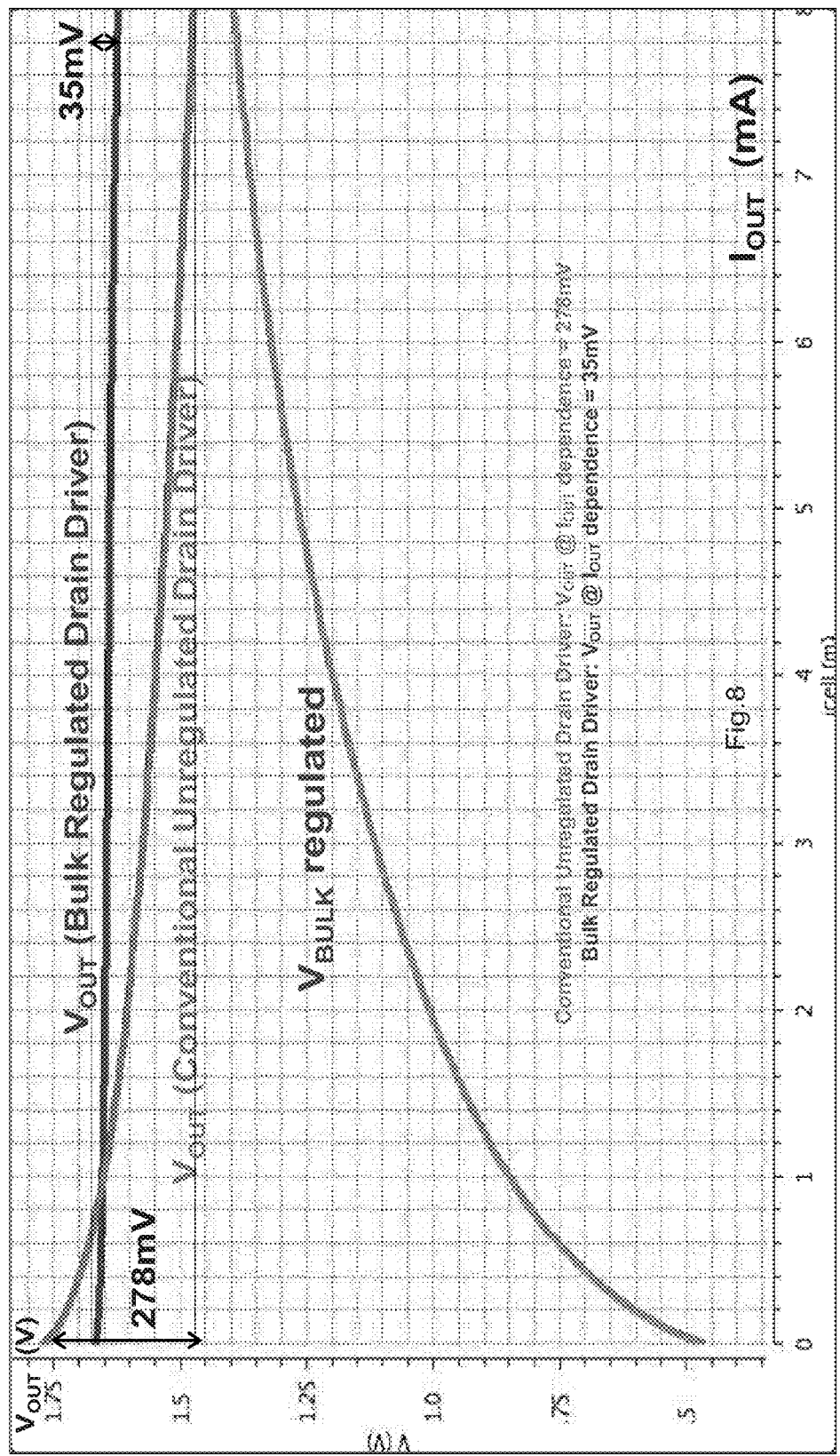
FIGS. 8A to 8C are various graphs indicating and comparing several electrical performance characteristics of an exemplary array drive according to embodiments relative to prior art array drivers.

Turning now to FIG. 7A, there is shown a block level circuit diagram of an exemplary bulk regulated array power supply circuit according to embodiments including a high voltage source. A reference branch 15 includes a transistor $M_2$ with grounded bulk and current source 12 generating $I_{Ref}$. The drain of transistor $M_2$ is connected to an output of the high voltage source 20 and its gate is connected to the gate of the bulk regulated transistor $M_1$. Both gates are connected to a switched HV source 21 whose output voltage is $V_{OUT} + V_{TH} + V_{DSAT}$. A bulk amplifier circuit 16 is connected to the bulk of $M_1$ and a discharge amplifier 17 is connected to source of terminal of $M_1$. The discharge amplifier 17 uses a reference voltage from the reference branch 15 as a reference relative to $V_{OUT}$, such that the discharge amplifier 17 starts drawing current from the source of $M_1$ when $V_{OUT}$ exceeds a voltage based on the reference branch voltage. Bulk amplifier 16 is likewise triggered to raise the bulk voltage of $M_1$ responsive to VOUT exceeding a voltage based on the reference branch voltage. Raising of the bulk voltage in concert with drawing current from the source of $M_1$ may result in compensation for load and current demand variations from array 30. This compensation may provide for a more stable and accurate $V_{OUT}$ across a range of loads and currents, as illustrated in graph of FIG. 8A.

Figure 7B:
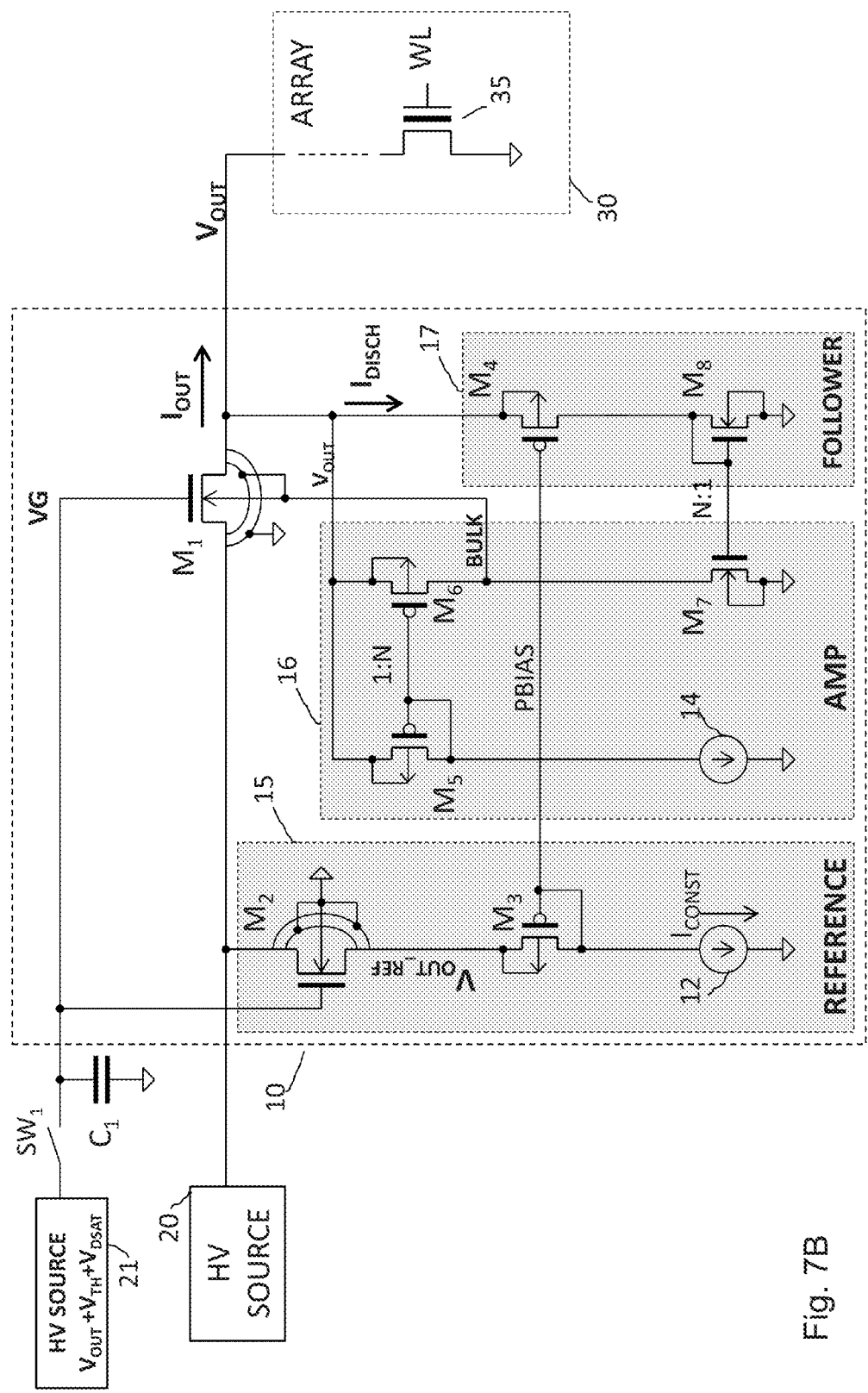
FIG. 7B is transistor level circuit diagram of an exemplary bulk regulated array power supply circuit according to embodiments.

Turning now to FIG. 7B, there is shown transistor level circuit diagram of the exemplary bulk regulated array power supply circuit according to embodiments such as the one shown in FIG. 7A. HV source (20) output voltage should be equal or higher then Drain driver output voltage ($V_{OUT}$) plus $V_{DSAT}$ voltage of regulated transistor M1. Gate voltage of the regulated transistor M1 is supplied by HV source (21) and sampled, thus it is not consumes power during drain driver operating. Reference branch (15) provides the reference voltage $V_{OUR\_REF}$, which is independent on drain driver output current. Transistor M3 shifts down $V_{OUR\_REF}$ to PBIAS level which is used by the follower (17) as an input reference voltage.

The ratio between transistors M1 and M2 defines the ratio between currents in the reference branch (15) and the follower branch (17), when the drain driver output voltage ($V_{OUT}$) is equal to the $V_{OUR\_REF}$. If drain driver output voltage ($V_{OUT}$) exceeds $V_{OUR\_REF}$, than higher current in the current mirror M7, M8 cause to decreasing of M1 bulk voltage (node BULK) and increasing effective M1 threshold voltage. If drain driver output voltage ($V_{OUT}$) drops below $V_{OUR\_REF}$, than lower current in the current mirror M7,M8 cause to increasing of M1 bulk voltage (node BULK) and decreasing effective M1 threshold voltage.

Since, the Follower branch (17) and Amplifier (16) are supplied by drain driver output voltage ($V_{OUT}$), the bulk voltage cannot exceed the source and drain voltages of the transistor M1. It means the bulk forward bias conditions cannot occur.

Figure 7C:
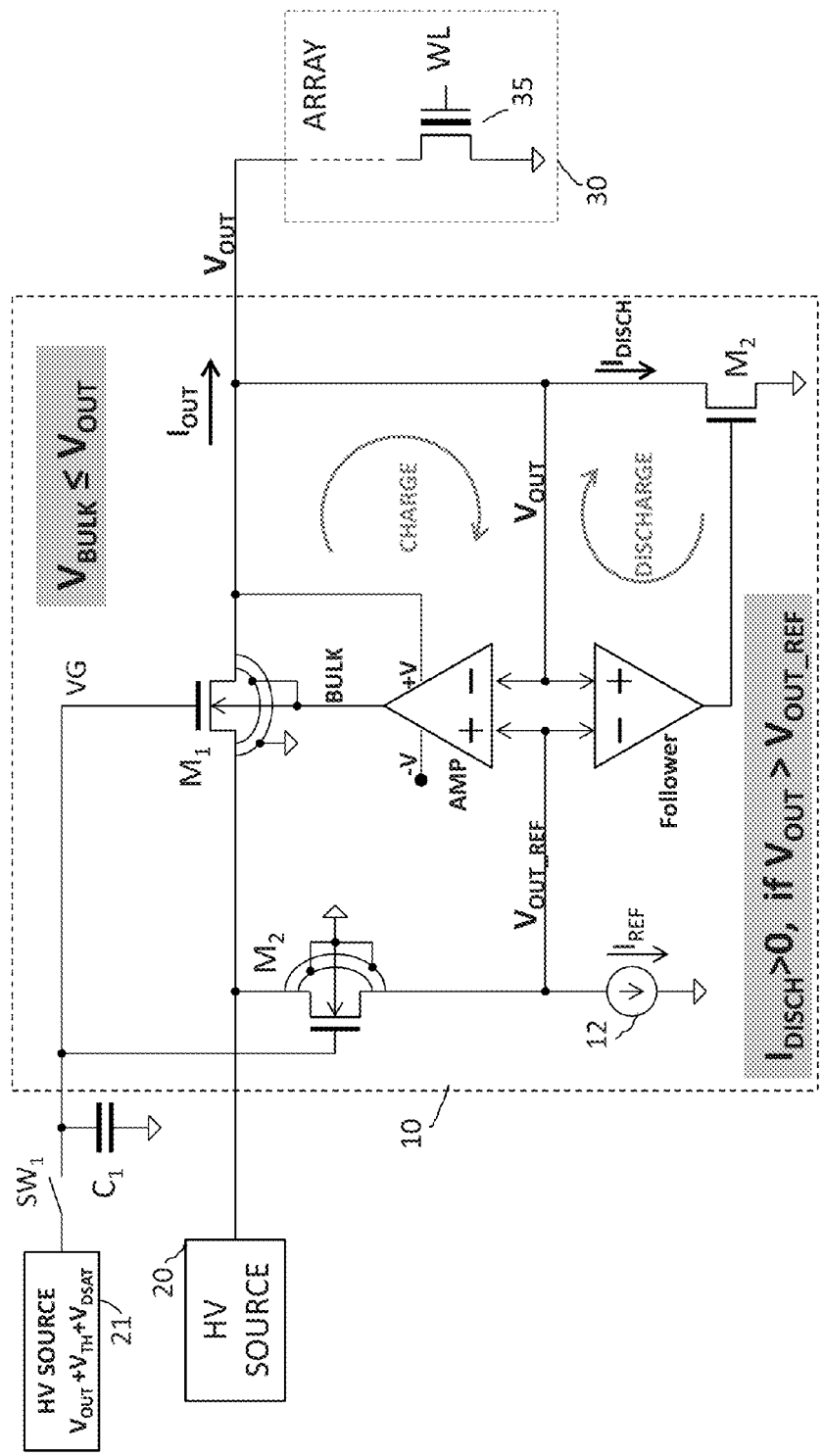
FIG. 7C is functional block and current flow circuit diagram of an exemplary bulk regulated array power supply circuit according to embodiments.
Figure 8B:
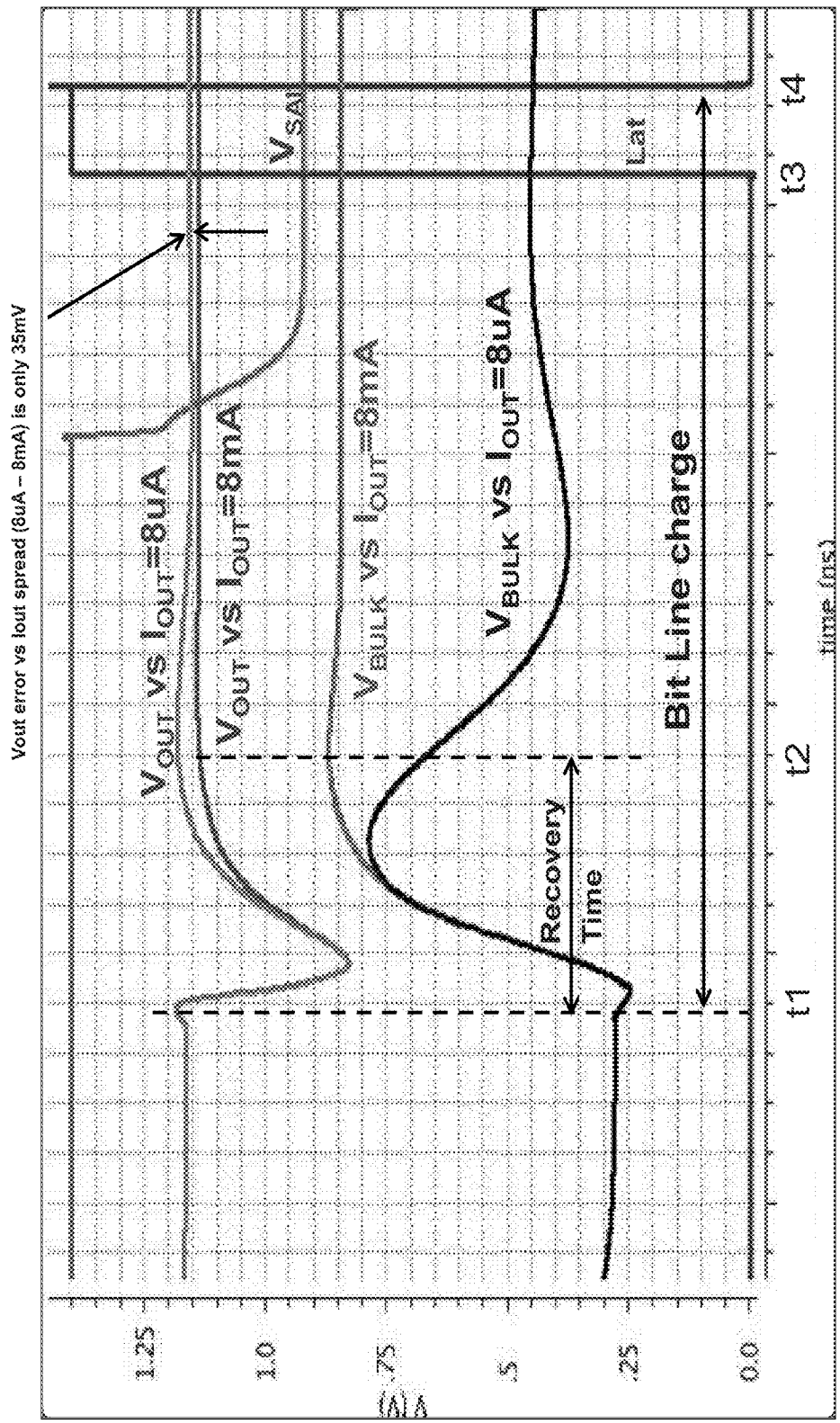
Figure 8C:
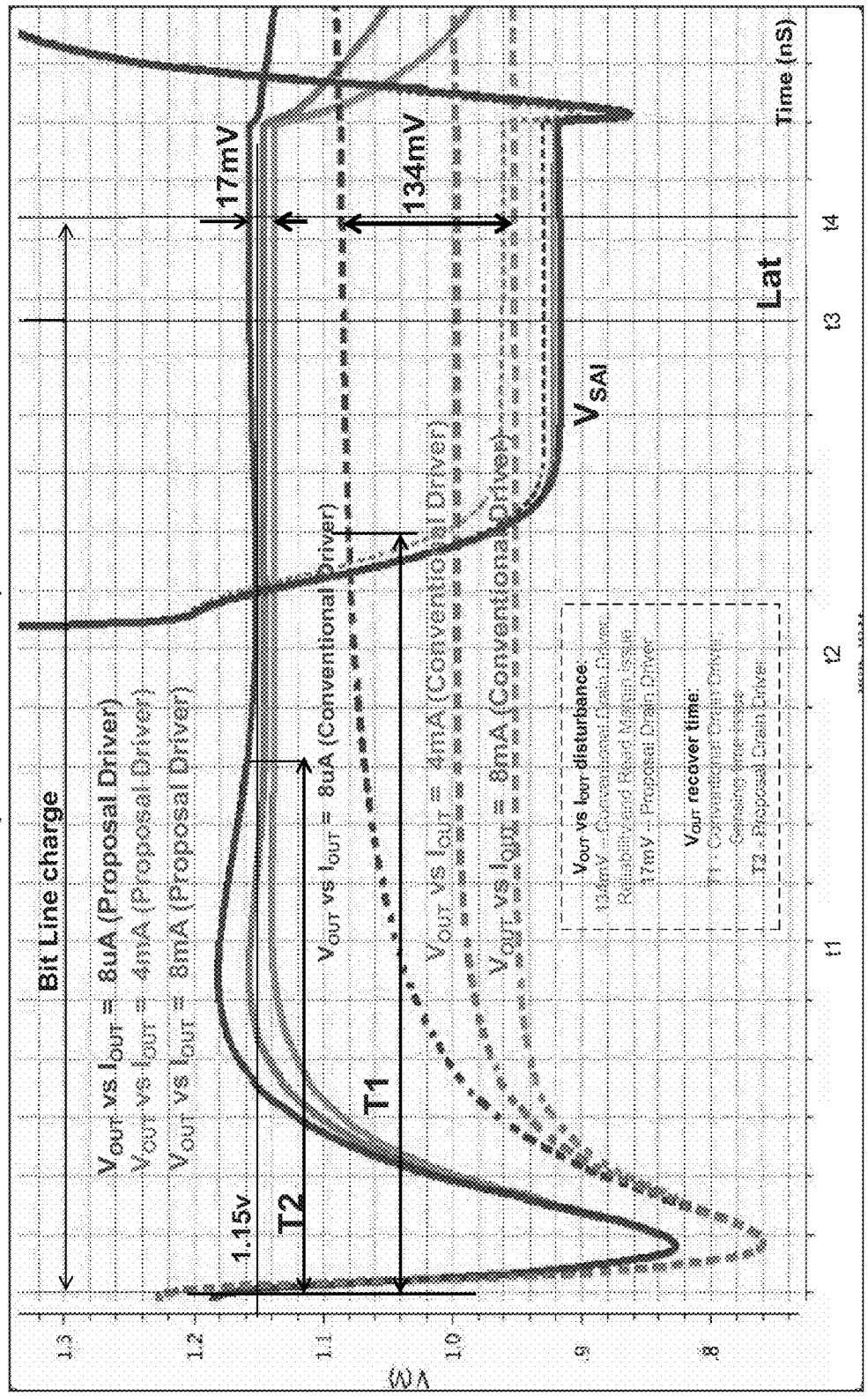

FIG. 7C is functional block and current flow circuit diagram of an exemplary bulk regulated array power supply circuit and corresponding to FIGS. 7A and 7B. Various electrical parameters of bulk regulated array drivers according to FIGS. 7A to 7C, relative to conventional array or drain driver, may be seen in the graphs of FIGS. 8A through 8C, which graphs are indicating and comparing several performance characteristics of an exemplary array drive according to embodiments relative to prior art array drivers.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:
1. A power supply circuit for a non-volatile memory (NVM) array, said circuit comprising:
   a voltage source adapted to output an array supply current at substantially a target voltage;
   a regulating transistor whose channel is in series between an output terminal of said voltage source and an input terminal of the NVM array; and
   a bulk regulating circuit branch coupled to a bulk of said regulating transistor and adapted to reduce a bulk-voltage of said regulating transistor when a voltage at the regulating transistor output terminal exceeds a first defined threshold voltage.

2. The circuit according to claim 1, further comprising a discharge circuit branch coupled to an output terminal of said regulating transistor and adapted to drain away current from the regulating transistor output terminal when a voltage at the regulating transistor output terminal exceeds a second defined threshold voltage.

3. The power supply circuit according to claim 2, wherein the first and the second threshold defined voltages are substantially the same.

4. The power supply circuit according to claim 2, further comprising a reference voltage branch adapted to provide a reference voltage to said discharge and said bulk regulating circuit branches based at least partially on an output of said voltage source.

5. The power supply circuit according to claim 1, wherein said regulating transistor is a field effect transistor (FET).

6. The power supply circuit according to claim 1, wherein said circuit is adapted to provide sensing current for concurrent sensing of a dynamic set of NVM cells.

7. The power supply circuit according to claim 6, wherein said regulating transistor output terminal is connected to a multiplexer configured to bridge current from said power supply circuit to at least one terminal of the dynamic set of NVM cells.

8. A non-volatile memory (NVM) device, said device comprising:
   a non-volatile memory array including a plurality of NVM cells;
   a voltage source adapted to output an NVM array supply current at substantially a target voltage;
   a regulating transistor whose channel is in series between an output terminal of said charge pump and an input terminal of said NVM array;
   a discharge circuit branch coupled to an output terminal of said regulating transistor and adapted to drain away current from the regulating transistor output terminal when a voltage at the regulating transistor output terminal exceeds a first defined threshold voltage; and
   a bulk regulating circuit branch coupled to a bulk of said regulating transistor and adapted to reduce a bulk-voltage of said regulating transistor when a voltage at the regulating transistor output terminal exceeds a second defined threshold voltage.

9. The non-volatile memory (NVM) device according to claim 8, wherein the first and the second threshold voltages are substantially the same.

10. The non-volatile memory (NVM) device according to claim 8, further comprising a reference voltage branch adapted to provide a reference voltage to said discharge and said bulk regulating circuit based at least partially on an output of said high voltage source.

11. The non-volatile memory (NVM) device according to claim 8, wherein said regulating transistor is a field effect transistor (FET).

12. The non-volatile memory (NVM) device according to claim 8, wherein said circuit is adapted to provide sensing current for concurrent sensing of a dynamic set of non-volatile memory cells.

13. The non-volatile memory (NVM) device according to claim 12, wherein said regulating transistor output terminal is connected to a multiplexer configured to bridge current from said power supply circuit to drain terminals of the dynamic set of non-volatile memory cells.

14. A method for supplying current to a dynamic load on an integrated circuit, said method comprising:
   generating supply current at substantially a target voltage;
   passing the supply current through a regulating transistor; and
   responsive to a voltage at the regulating transistor output terminal exceeding a first defined threshold voltage reducing a bulk-voltage of said regulating transistor.

15. The method according to claim 14, further comprising draining away current from the regulating transistor output terminal.

16. The method according to claim 15, wherein draining away current is responsive to the voltage at the regulating transistor output terminal exceeding a second defined threshold voltage.

17. The method according to claim 16, wherein the first and second threshold voltages are substantially the same.

18. The method according to claim 14, further comprising generating a reference voltage used to determine when the regulating transistor output terminal exceeds a first or a second threshold voltage.

19. A power supply circuit for providing electrical power to a dynamic load, said supply circuit comprising:
   a voltage source adapted to output a supply current at substantially a target voltage associated with the load;
   a regulating transistor whose channel is in series between an output terminal of said voltage source and an input terminal of the dynamic load; and
   a bulk regulating circuit branch coupled to a bulk of said regulating transistor and adapted to reduce a bulk-voltage of said regulating transistor when a voltage at the regulating transistor output terminal exceeds a first defined threshold voltage.

20. The circuit according to claim 19, further comprising a discharge circuit branch coupled to an output terminal of said regulating transistor and adapted to drain away current from the regulating transistor output terminal when a voltage at the regulating transistor output terminal exceeds a second defined threshold voltage.

21. The power supply circuit according to claim 20, wherein the first and the second threshold defined voltages are substantially the same.

22. The power supply circuit according to claim 20, further comprising a reference voltage branch adapted to provide a reference voltage to said discharge and said bulk regulating circuit branches based at least partially on an output of said voltage source.

23. The power supply circuit according to claim 19, wherein said regulating transistor is a field effect transistor (FET).

24. The power supply circuit according to claim 19, wherein said supply circuit is adapted to provide current to a dynamic load comprised of a switchable set of loads.

* * * * *